(12) United States Patent
Chang et al.

(10) Patent No.: US 11,705,540 B2
(45) Date of Patent: Jul. 18, 2023

(54) DISPLAY DEVICE AND MANUFACTURING METHOD THEREOF

(71) Applicant: SAMSUNG DISPLAY CO., LTD., Yongin-si (KR)

(72) Inventors: Chongsup Chang, Hwaseong-si (KR); Youngdae Kim, Seoul (KR); Hyunae Kim, Seoul (KR); Euikang Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/046,764

(22) Filed: Oct. 14, 2022

(65) Prior Publication Data

US 2023/0065735 A1 Mar. 2, 2023

Related U.S. Application Data

(62) Division of application No. 16/543,285, filed on Aug. 16, 2019, now Pat. No. 11,476,392.

(30) Foreign Application Priority Data

Nov. 6, 2018 (KR) .......................... 10-2018-0135435

(51) Int. Cl.
*H01L 33/38* (2010.01)
*H01L 33/62* (2010.01)
*H01L 27/15* (2006.01)
*H01L 27/12* (2006.01)

(52) U.S. Cl.
CPC ............ *H01L 33/38* (2013.01); *H01L 27/156* (2013.01); *H01L 33/62* (2013.01); *H01L 27/1251* (2013.01); *H01L 2933/0016* (2013.01); *H01L 2933/0066* (2013.01)

(58) Field of Classification Search
CPC combination set(s) only.
See application file for complete search history.

(56) References Cited

U.S. PATENT DOCUMENTS

| 9,190,590 | B2 | 11/2015 | Shibata et al. |
| 9,773,761 | B2 | 9/2017 | Do |
| 2015/0194572 | A1* | 7/2015 | Kwon ..................... H01L 33/20 257/98 |
| 2017/0141279 | A1 | 5/2017 | Do et al. |
| 2017/0317228 | A1 | 11/2017 | Sung |
| 2018/0012876 | A1 | 1/2018 | Kim |

(Continued)

FOREIGN PATENT DOCUMENTS

| KR | 10-1490758 B1 | 2/2015 |
| KR | 10-2015-0098246 A | 8/2015 |

(Continued)

*Primary Examiner* — Ratisha Mehta
(74) *Attorney, Agent, or Firm* — Lewis Roca Rothgerber Christie LLP

(57) ABSTRACT

A display device includes a substrate, a first electrode disposed on the substrate, a second electrode disposed on the substrate and spaced apart from the first electrode, a plurality of first protruding electrodes disposed on the first electrode, a plurality of second protruding electrodes disposed on the second electrode, and a plurality of light emitting elements electrically connected to the plurality of first protruding electrodes and the plurality of second protruding electrodes.

8 Claims, 12 Drawing Sheets

(56) References Cited

U.S. PATENT DOCUMENTS

2018/0019369 A1    1/2018  Cho et al.
2018/0175268 A1*   6/2018  Moon ................... H01L 27/15

FOREIGN PATENT DOCUMENTS

| KR | 10-1672781     B1 | 11/2016 |
| KR | 10-1730929     B1 |  4/2017 |
| KR | 10-2018-0007025 A |  1/2018 |
| KR | 10-2020-0022061 A |  3/2020 |

* cited by examiner

DISPLAY DEVICE AND MANUFACTURING METHOD THEREOF

CROSS-REFERENCE TO RELATED APPLICATIONS

This application is a continuation of U.S. patent application Ser. No. 16/543,285, filed Aug. 16, 2019, which claims priority to and the benefit of Korean Patent Application No. 10-2018-0135435, filed Nov. 6, 2018, the entire content of both of which is incorporated herein by reference.

BACKGROUND

The present disclosure relates to a display device and a method of manufacturing the same, and more particularly, to a display device capable of improving an alignment degree of light emitting elements and a method of manufacturing the same.

Generally, a display device includes a plurality of pixels for displaying an image. There are various types of pixels such as a pixel including a liquid crystal layer, a pixel including an electrowetting layer, a pixel including an electrophoretic layer, and a pixel including a light emitting element. Among them, a display device including a self-light light emitting element does not require a separate light source.

Recently, as a light emitting element, a microscale light emitting diode (LED) element is under development. The microscale LED element may be manufactured in nano or micro units and has a rod-like or bar-like shape. The microscale LED elements may be horizontally arranged and electrically connected to a first electrode and a second electrode having opposite polarities.

Voltages of the opposite polarities are applied to the first electrode and the second electrode, and a plurality of microscale LED elements are aligned toward the first electrode and the second electrode by an electric field formed between the first electrode and the second electrode. However, when a plurality of microscale LED elements is provided for the first electrode and the second electrode, the microscale LED elements may not be uniformly aligned.

SUMMARY

The present disclosure provides a display device capable of improving an alignment degree of light emitting elements and a method of manufacturing the same.

An embodiment of the inventive concept provides a display device including: a substrate; a first electrode disposed on the substrate; a second electrode disposed on the substrate and spaced apart from the first electrode; a plurality of first protruding electrodes disposed on the first electrode; a plurality of second protruding electrodes disposed on the second electrode; and a plurality of light emitting elements electrically connected to the plurality of first protruding electrodes and the plurality of second protruding electrodes.

In an embodiment of the inventive concept, a manufacturing method of a display device includes: providing a first conductive material on a substrate; providing a second conductive material on the first conductive material; providing a first photoresist pattern including a first portion on the second conductive material and a plurality of second portions spaced apart from each other and disposed on the first portion; removing portions of the first and second conductive materials that are exposed by the first photoresist pattern to form a first electrode and a second electrode defined by remaining portions of the first conductive material; removing the first photoresist pattern from an upper portion of the first photoresist pattern by a thickness of the first portion to form a second photoresist pattern; removing portions of the second conductive material that are exposed by the second photoresist pattern to form a plurality of first protruding electrodes and a plurality of second protruding electrodes; and electrically connecting a plurality of light emitting elements to the plurality of first protruding electrodes and the plurality of second protruding electrodes.

BRIEF DESCRIPTION OF THE FIGURES

The accompanying drawings are included to provide a further understanding of the inventive concept, and are incorporated in and constitute a part of the present specification. The drawings illustrate exemplary embodiments of the inventive concept and, together with the description, serve to explain principles of the inventive concept. In the drawings.

DETAILED DESCRIPTION

Figure 1:
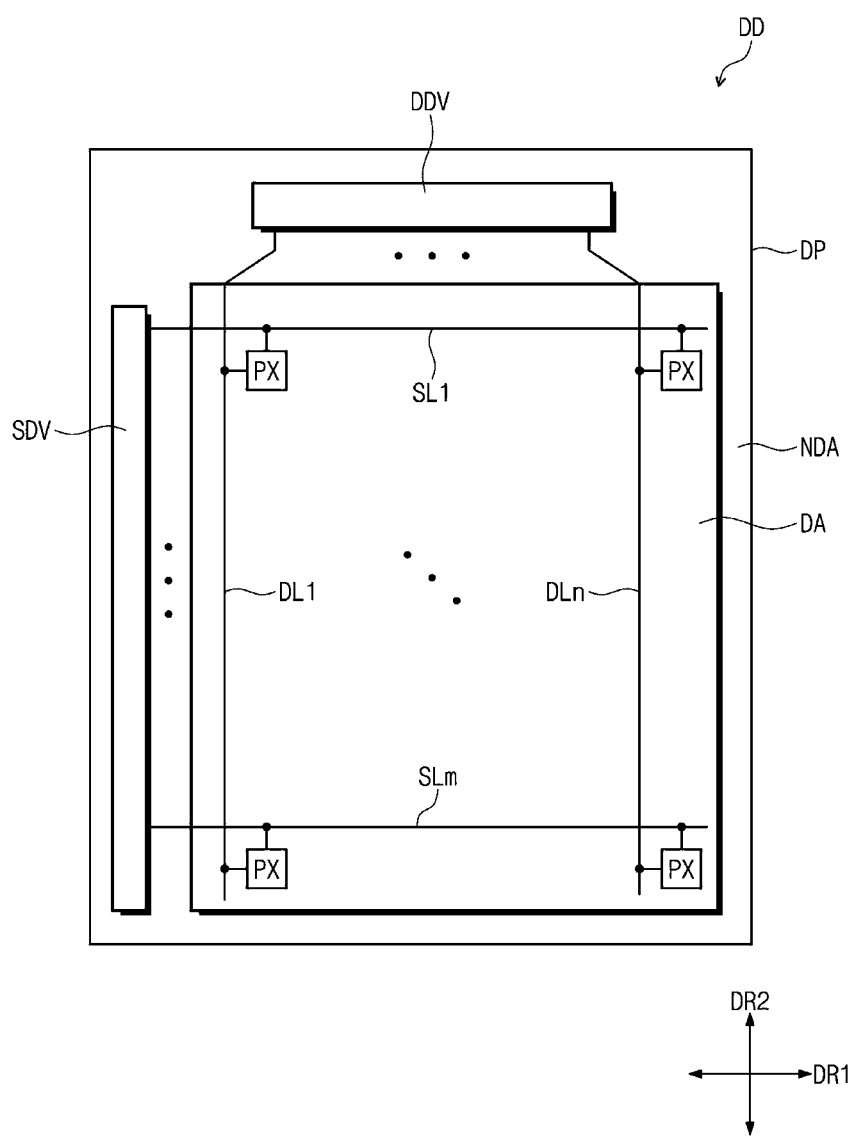
FIG. 1 is a plan view of a display device according to an embodiment of the inventive concept.

In the present specification, a component (or an area, a layer, a part, etc.) that is referred to as being "on", "connected to," or "combined to" another component means that the component may be directly on, connected to, or combined to the other component, or a third component therebetween may be present.

Like reference numerals refer to like elements. Additionally, in the drawings, the thicknesses, proportions, and dimensions of components are exaggerated for the convenience of description.

The term "and/or" includes all of one or more combinations defined by listed components.

It will be understood that the terms "first" and "second" are used herein to describe various components, but these components should not be limited by these terms. The above terms are used only to distinguish one component from another. For example, a first component may be referred to as a second component and vice versa without departing from the scope of the inventive concept. The singular expressions include plural expressions unless the context clearly dictates otherwise.

In addition, terms such as "below," "lower," "on," and "upper" are used to describe a relationship of configurations shown in the drawing. These terms are described as a relative concept based on an orientation shown in the drawing. For example, "below" may become "on," and "on"

become "below" if the orientation of the drawing is switched upside down or downside up.

Unless otherwise defined, all terms (including technical and scientific terms) used herein have the same meaning as terms commonly understood by those skilled in the art to which the present disclosure pertains. In addition, terms such as terms defined in commonly used dictionaries should be interpreted as having a meaning that is consistent with meaning in the context of the related art, and unless the term is interpreted in an ideal or overly formal sense, they may be explicitly defined herein.

In various embodiments of the inventive concept, the term "include," "comprise," "including," or "comprising" specifies a property, a region, a fixed number, a step, a process, an element, and/or a component but does not exclude other properties, regions, fixed numbers, steps, processes, elements, and/or components.

Hereinafter, exemplary embodiments of the inventive concept are described in more detail with reference to the accompanying drawings.

FIG. 1 is a plan view of a display device according to an embodiment of the inventive concept.

Referring to FIG. 1, a display device DD according to an embodiment of the present disclosure may include a display panel DP, a scan driver SDV, and a data driver DDV. The scan driver SDV and the data driver DDV may be disposed on the display panel DP.

The display panel DP may have a rectangular shape having short sides in a first direction DR1 and long sides in a second direction DR2 that intersects the first direction DR1. However, the present disclosure is not limited to this, and the display panel DP may have various shapes such as a circular shape and a polygonal shape.

The display panel DP may include a display area DA and a non-display area NDA that surrounds the display area DA. The display area DA may correspond to an area for displaying an image, and the non-display area NDA may correspond to an area that does not display an image.

The display panel DP may include a plurality of pixels PX, a plurality of scan lines SL1 to SLm, and a plurality of data lines DL1 to DLn, where m and n are natural numbers. Illustratively, the pixels PX may be arranged in a matrix form, but the arrangement form of the pixels PX is not limited thereto.

The pixels PX may be disposed in the display area DA and connected to the scan lines SL1 to SLm and the data lines DL1 to DLn. Each of the pixels PX may include a light emitting element for displaying an image.

The scan driver SDV and the data driver DDV may be disposed in the non-display area NDA. The scan driver SDV may be disposed in the non-display area NDA adjacent to one of the long sides of the display panel DP. The data driver DDV may be disposed in the non-display area NDA adjacent to one of the short sides of the display panel DP.

The scan lines SL1 to SLm may extend in the first direction DR1 and may be connected to the scan driver SDV. The data lines DL1 to DLn may extend in the second direction DR2 and may be connected to the data driver DDV.

The scan driver SDV generates a plurality of scan signals, and the scan signals may be applied to the pixels PX through the scan lines SL1 to SLm. The scan signals may be sequentially applied to the pixels PX. The data driver DDV generates a plurality of data voltages, and the data voltages may be applied to the pixels PX through the data lines DL1 to DLn.

Although not shown in the drawings, the display device DD may include a timing controller for controlling the operation of the scan driver SDV and the data driver DDV. For example, the timing controller may generate a scan control signal and a data control signal in response to externally received control signals. The timing controller may also receive image signals externally, and convert the data format of the image signals to match the interface specification with the data driver DDV, and provide the converted image signals to the data driver DDV. It is noted that the data format of the externally received image signals may not need to be converted if the image signals comply with the interface specification with the data driver DDV.

The scan driver SDV may generate scan signals in response to the scan control signal. The data driver DDV may receive the image signals from the timing controller and may generate the data voltages corresponding to the image signals in response to the data control signal.

The pixels PX may be provided with the data voltages through the data lines DL1 to DLn in response to the scan signals that are received through scan lines SL1 to SLm. The pixels PX can display an image by emitting light of a luminance corresponding to the data voltages.

Figure 2:
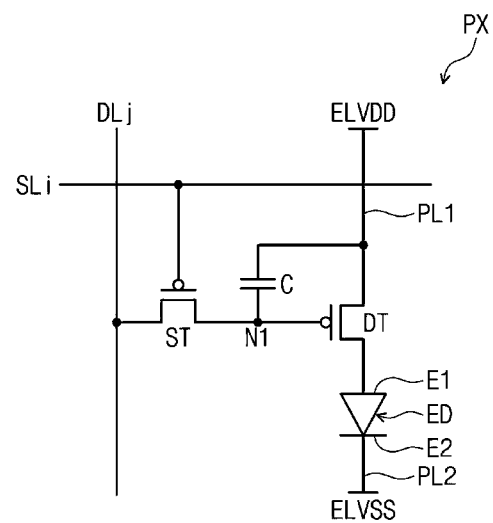
FIG. 2 is an equivalent circuit diagram of a pixel shown in FIG. 1.

FIG. 2 is an equivalent circuit diagram of a pixel shown in FIG. 1.

Although FIG. 2 shows an equivalent circuit diagram of one pixel PX of the pixels PX shown in FIG. 1, other pixels PX shown in FIG. 1 may have the same equivalent circuit diagram as the pixel PX shown in FIG. 2. Illustratively, a pixel PX connected to the scan line SLi and the data line DLj is shown in FIG. 2., where i and j are natural numbers equal to and greater than 1 and equal to or less than m and n, respectively.

Referring to FIG. 2, the pixel PX may include a light emitting element ED (e.g., a light emitting diode), a driving element DT (e.g., a driving transistor), a capacitance element C (e.g., a capacitor), and a switching element ST (e.g., a switching transistor). The light emitting element ED may collectively represent a plurality of light emitting elements ED included in the pixel PX. A plurality of light emitting elements ED included in the pixel PX will be shown in FIG. 3 below.

According to one embodiment, the driving element DT and the switching element ST may be P-type transistors. However, the present disclosure is not limited thereto, and the driving element DT and the switching element ST may be N-type transistors. The capacitance element C may be a capacitor.

The driving element DT includes an input terminal connected to a first cap electrode of the capacitance element C and a first power supply line PL1, an output terminal connected to the light emitting element ED, and a control terminal connected to an output terminal of the switching element ST. The driving element DT may receive a first power supply voltage ELVDD through the first power supply line PL1. A second cap electrode of the capacitance element C may be connected to the control terminal of the driving element DT at a first node N1.

The switching element ST may include an input terminal connected to the data line DLj, the output terminal connected to the control terminal of the driving element DT through the first node N1, and a control terminal connected to the scan line SLi.

The light emitting element ED may be connected to the driving element DT and a second power supply line PL2. For example, the light emitting element ED may be connected to a first electrode E1 that is electrically connected to the driving element DT and a second electrode E2 that is electrically connected to the second power supply line PL2.

The light emitting element ED can receive a second power supply voltage ELVSS through the second power supply line PL2. The second power supply voltage ELVSS may be lower than the first power supply voltage ELVDD.

A scan signal may be applied to the control terminal of the switching element ST through the scan line SLi, and the switching element ST can be turned on in response to the scan signal. When it is turned-on, the switching element ST may provide the data voltage that is received through the data line DLj to the first node N1.

The capacitance element C can charge an amount of charge corresponding to the difference between the data voltage provided to the first node N1 and the first power supply voltage ELVDD and maintain the charge even after the switching element ST is turned off.

The driving element DT can be turned on according to the amount of charge charged in the capacitance element C. The turn-on time of the driving element DT may be determined according to the amount of charge charged in the capacitance element C. Current may flow through the light emitting element ED when the driving element DT is turned on, and the light emitting element ED emits light. The light emitting element ED may emit light to generate an image.

The light emitting element ED may represent one or more microscale LED elements. A microscale LED element may have a length of several nanometers to several hundreds of micrometers. It is noted that this is merely an example, and the length of the microscale LED element is not limited to the above numerical range.

Figure 3:
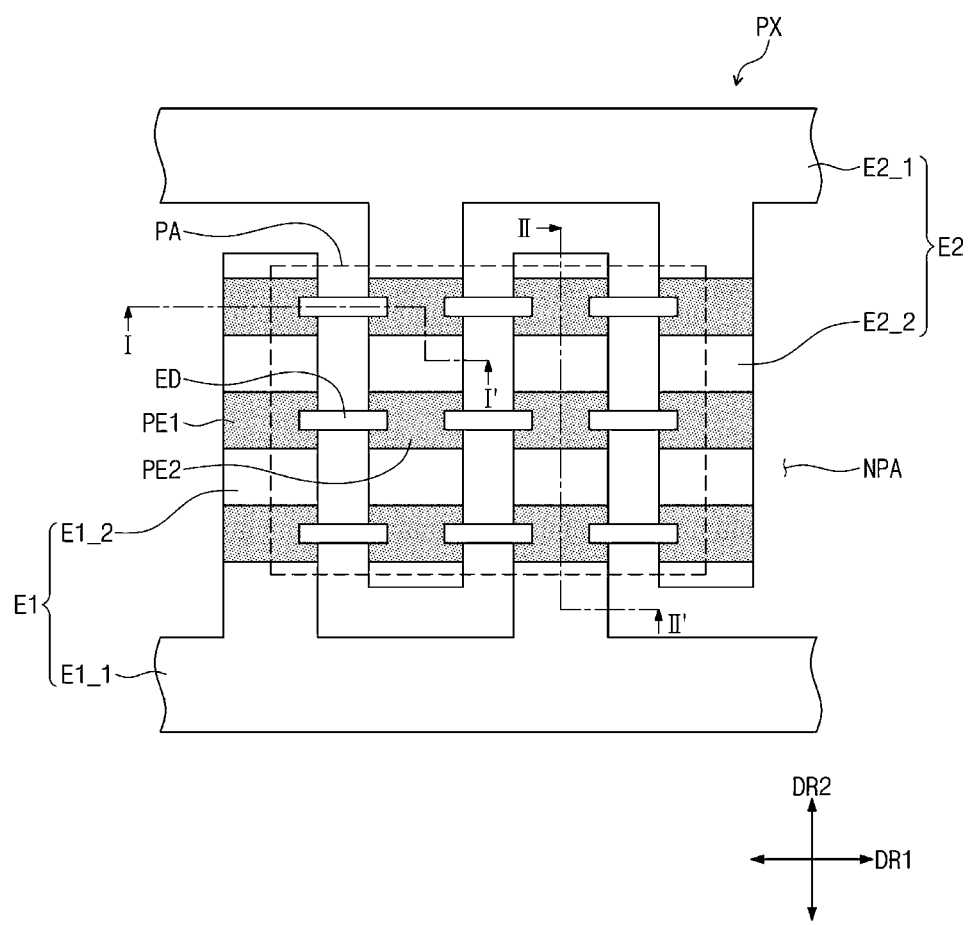
FIG. 3 is a plan view illustrating the pixel shown in FIG. 2 including a first electrode and a second electrode that are connected to the light emitting element.

FIG. 3 is a plan view illustrating the pixel shown in FIG. 2 including a first electrode and a second electrode that are connected to the light emitting element.

Referring to FIG. 3, the first electrode E1 includes a first extension portion E1_1 extending in the first direction DR1 and a plurality of first branch portions E1_2 extending from the first extension portion E1_1 in the second direction DR2 toward the second electrode E2. Although two first branch portions E1_2 are shown illustratively, the number of the first branch portions E1_2 is not limited thereto.

The second electrode E2 may include a second extension portion E2_1 extending in the first direction DR1 and a plurality of second branch portions E2_2 extending from the second extension portion E2_1 in the second direction DR2 toward the first electrode E1. Although two second branch portions E2_2 are shown illustratively, the number of the second branch portions E2_2 is not limited thereto. The first branch portions E1_2 and the second branch portions E2_2 may be disposed as being spaced apart from each other in a 1:1 alternation in the first direction DR1.

The pixel PX may include a plurality of first protruding electrodes PE1 disposed on the first electrode E1 and a plurality of second protruding electrodes PE2 disposed on the second electrode E2. The first protruding electrodes PE1 may be disposed on the first branch portions E1_2 in one or more rows corresponding to a number of rows of microscale LEDs. Similarly, the second protruding electrodes PE2 may be disposed on the second branch portions E2_2 in one or more rows corresponding to a number of rows of the microscale LEDs. Although three rows of the microscale LEDs, the first protruding electrodes PE1, and the second protruding electrodes PE2 are shown illustratively, the number of rows of the microscale LEDs, the first protruding electrodes PE1, and the second protruding electrodes PE2 is not limited thereto.

The first protruding electrodes PE1 may be electrically connected to the first electrode E1 by contacting the first branch portions E1_2. The first protruding electrodes PE1 may The second protruding electrodes PE2 may be electrically connected to the second electrode E2 by contacting the second branch portions E2_2.

The first protruding electrodes PE1 may be arranged in the second direction DR2. The first protruding electrodes PE1 may be evenly spaced in the second direction DR2. The second protruding electrodes PE2 may be arranged in the second direction DR2. The second protruding electrodes PE2 may be evenly spaced in the second direction DR2. A spatial gap between the adjacent first protruding electrodes PE1 and the adjacent second protruding electrodes PE2 in the second direction DR2 may be substantially the same as a spatial gap between the adjacent first branch portions E1_2 and the adjacent second branch portions E2_2 in the second direction DR2.

The pixel PX may include a plurality of light emitting elements ED. The light emitting elements ED are disposed to overlap at least a portion of the first protruding electrodes PE1 and the second protruding electrodes PE2 and are electrically connected to the first protruding electrodes PE1 and the second protruding electrodes PE2. Both sides of each of the light emitting elements ED may be respectively disposed on a corresponding pair of first and second protruding electrodes PE1 and PE2 among the first and second protruding electrodes PE1 and PE2 included in the pixel PX. The both sides of each of the light emitting elements ED may contact the corresponding pair of first and second protruding electrodes PE1 and PE2, respectively.

The pixel PX may include a pixel area PA and a non-pixel area NPA around the pixel area PA in a plan view. The light emitting elements ED may be disposed in the pixel area PA.

Figure 4:
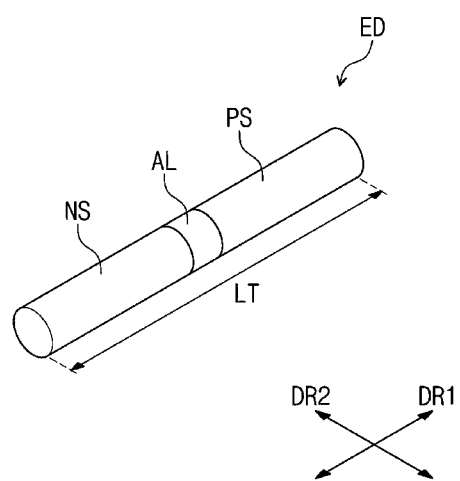
FIG. 4 is a perspective view of one light emitting element shown in FIG. 3.

FIG. 4 is a perspective view of one light emitting element ED shown in FIG. 3.

Although one light emitting element ED is illustratively shown in FIG. 4, other light emitting elements ED included in the pixel PX will have the same configuration as the light emitting element ED shown in FIG. 4.

Referring to FIG. 4, the light emitting element ED may have a cylindrical shape extending in the first direction DR1. However, the present disclosure is not limited to this, and the light emitting element ED may have a polygonal columnar shape extending in the first direction DR1. The light emitting element ED may be horizontally aligned (e.g., in the first direction DR1) and disposed on a pair of first and second protruding electrodes PE1 and PE2.

The light emitting element ED may include an n-type semiconductor layer NS, a p-type semiconductor layer PS, and an active layer AL that is disposed between the n-type semiconductor layer NS and the p-type semiconductor layer PS. The n-type semiconductor layer NS may be formed by doping an n-type dopant into a semiconductor layer. The p-type semiconductor layer PS may be formed by doping a p-type dopant into a semiconductor layer. The semiconductor layer may include a semiconductor material. For example, the semiconductor layer may include gallium nitride (GaN), aluminum nitride (AlN), aluminum gallium nitride (AlGaN), indium gallium nitride (InGaN), indium nitride (InN), indium aluminum gallium nitride (InAlGaN), or aluminum indium nitride (AlInN), but the present disclosure is not limited thereto.

The n-type dopant may be silicon (Si), germanium (Ge), tin (Sn), selenium (Se), tellurium (Te), or a combination thereof, but the present disclosure is not limited thereto. The p-type dopant may be magnesium (Mg), zinc (Zn), calcium (Ca), strontium (Sr), barium (Ba), or a combination thereof, but the present disclosure is not limited thereto.

The active layer AL may be formed of at least one of a single quantum well structure, a multiple quantum well structure, a quantum wire structure, and a quantum dot structure. The active layer AL may correspond to an area where electrons injected through the n-type semiconductor layer NS and holes injected through the p-type semiconductor layer PS are recombined. The active layer AL may be defined by a layer that emits light with energy determined by a material-specific energy band. The position of the active layer AL can be varied depending on a type of the light emitting element ED.

The n-type semiconductor layer NS may be connected to one of the first electrode E1 and the second electrode E2. The p-type semiconductor layer PS may be connected to the other one of the first electrode E1 and the second electrode E2.

The length LT of the light emitting element ED may be between a few nanometers and a few hundred micrometers. For example, the length LT of the light emitting element ED may be from 1 micrometer to 100 micrometers.

Figure 5:
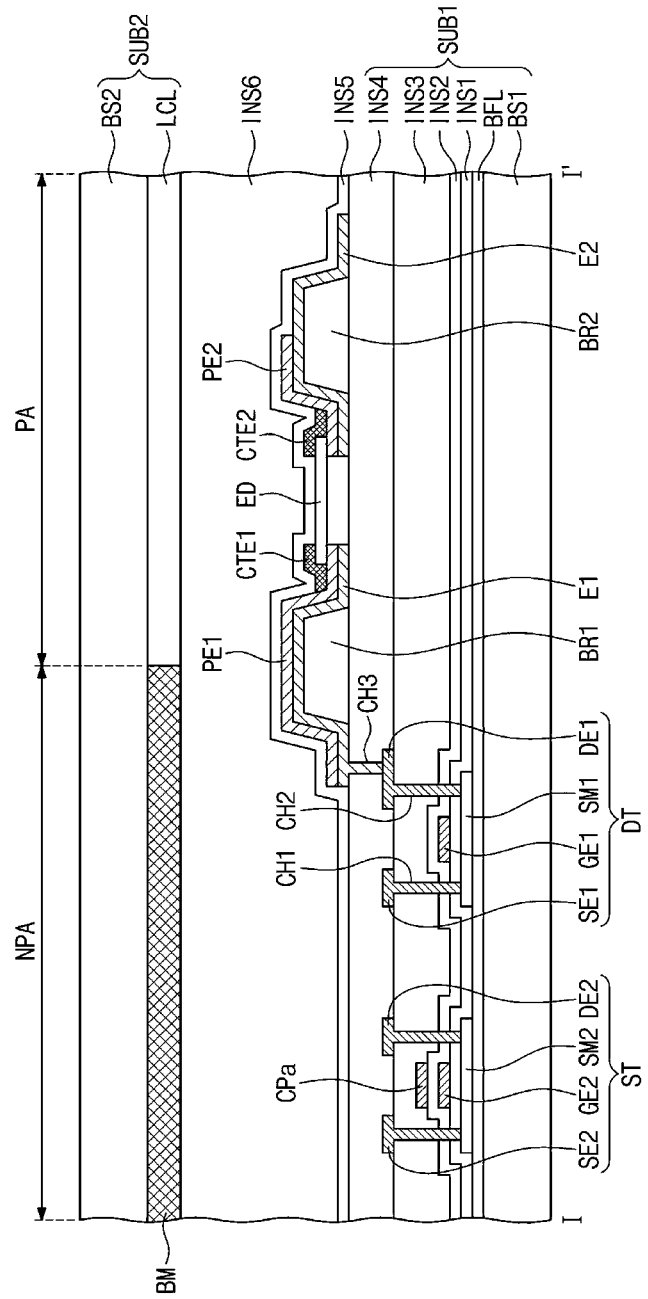
FIG. 5 is a cross-sectional view taken along a line I-I' of FIG. 3.
Figure 6:
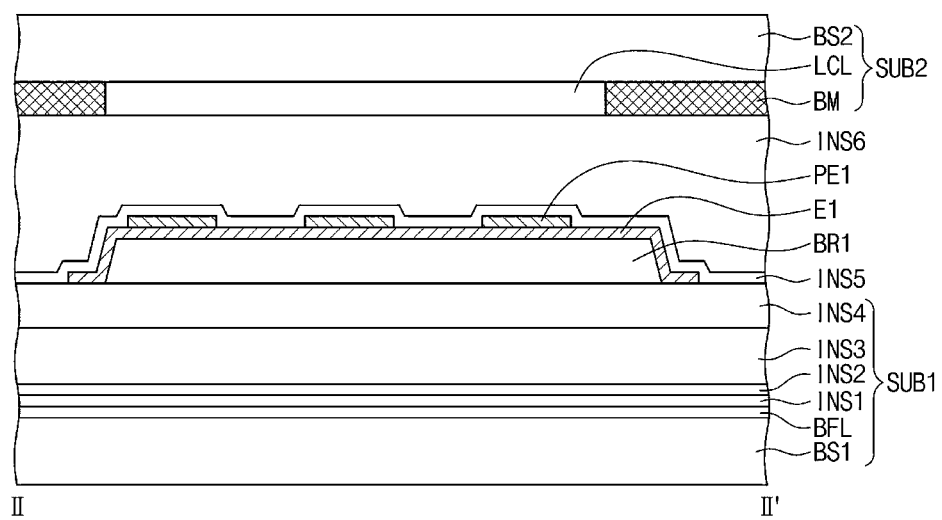
FIG. 6 is a cross-sectional view taken along a line II-II' of FIG. 3.

FIG. 5 is a cross-sectional view taken along a line I-I' of FIG. 3. FIG. 6 is a cross-sectional view taken along a line II-II' of FIG. 3.

Referring to FIGS. 2, 5, and 6, the pixel PX may include the driving element DT, the switching element ST, the first electrode E1, the second electrode E2, and the light emitting element ED. The driving element DT, the switching element ST, the first and second electrodes E1 and E2, and the light emitting element ED may be disposed on a first base substrate BS1.

A second base substrate BS2 may face the first base substrate BS1. The driving element DT, the switching element ST, the first and second electrodes E1 and E2, and the light emitting element ED may be disposed between the first base substrate BS1 and the second base substrate BS2. Each of the first and second base substrates BS1 and BS2 may be a silicon substrate, a plastic substrate, a glass substrate, an insulating film, or a laminated structure including one or more insulating layers.

According to one embodiment, the configuration of the driving element DT and the configuration of the switching element ST may be substantially the same. Hereinafter, the configuration of the driving element DT will be mainly described, and the configuration of the switching element ST will be briefly described or omitted.

A buffer layer BFL may be disposed on the first base substrate BS1. The buffer layer BFL may include an inorganic material. The driving element DT and the switching element ST may be disposed on the buffer layer BFL.

The driving element DT may include a first gate electrode GE1, a first source electrode SE1, a first drain electrode DE1, and a first semiconductor layer SM1. The switching element ST may include a second gate electrode GE2, a second source electrode SE2, a second drain electrode DE2, and a second semiconductor layer SM2.

The second gate electrode GE2, the second source electrode SE2, the second drain electrode DE2, and the second semiconductor layer SM2 of the switching element ST may respectively have the same structures as the first gate electrode GE1, the first source electrode SE1, the drain electrode DE1, and the first semiconductor layer SM1 driving element DT, and may be respectively disposed on the same layer.

The first semiconductor layer SM1 may be disposed on the buffer layer BFL. The first semiconductor layer SM1 may include an inorganic semiconductor material such as amorphous silicon or poly silicon, or an organic semiconductor material. Additionally, the first semiconductor layer SM1 may include an oxide semiconductor material. Although not shown in FIG. 5, the first semiconductor layer SM1 may include a source area, a drain area, and a channel area that is disposed between the source area and the drain area.

A surface of the buffer layer BFL corresponding to the first semiconductor layer SM1 may be modified or treated before the first semiconductor layer SM1 is placed thereon. In this case, the first semiconductor layer SM1 may adhere to the buffer layer BFL stronger compared to a case in which the surface of the buffer layer BFL is unmodified or untreated surface. The buffer layer BFL may serve as a barrier layer for protecting a lower surface of the first semiconductor layer SM1. In this case, the buffer layer BFL can prevent contamination or moisture from penetrating into the first semiconductor layer SM1 through the first base substrate BS1.

A first insulating layer INS1 may be disposed on the buffer layer BFL and cover the first semiconductor layer SM1. The first insulating layer INS1 may include an inorganic material. For example, the first insulating layer INS1 may include silicon nitride, silicon oxynitride, silicon oxide, titanium oxide, or aluminum oxide, but the present disclosure is not limited thereto.

The first gate electrode GE1 may be disposed on the first insulating layer INS1 overlapping the first semiconductor layer SM1. For example, the first gate electrode GE1 may overlap the channel area of the first semiconductor layer SM1. A second insulating layer INS2 may be disposed on the first insulating layer INS1 and cover the first gate electrode GE1. The second insulating layer INS2 may include an inorganic material.

The capacitance element C (shown in FIG. 2) may include a first cap electrode (not shown) and a second cap electrode CPa. The first cap electrode may be branched off from the second gate electrode GE2, and the second cap electrode CPa may be disposed on the second insulating layer INS2.

A third insulating layer INS3 may be disposed on the second insulating layer INS2 and cover the second cap electrode CPa. The third insulating layer INS3 may be referred to as an interlayer insulating layer. The third insulating layer INS3 may include an organic material and/or an inorganic material.

The first source electrode SE1 and the first drain electrode DE1 may be spaced apart from each other and disposed on the third insulating layer INS3. The first source electrode SE1 is connected to the source area of the first semiconductor layer SM1 through a first contact hole CH1 that is defined by penetrating the first, second, and third insulating layers INS1, INS2 and INS3. The first drain electrode DE1 is connected to the drain area of the first semiconductor layer SM1 through a second contact hole CH2 that is defined by penetrating the first, second, and third insulating layers INS1, INS2 and INS3.

A fourth insulating layer INS4 may be disposed on the third insulating layer INS3 and cover the first source electrode SE1 and the first drain electrode DE1. The fourth insulating layer INS4 may include a planarization film that provides a flat upper surface, and may include an organic material.

A first substrate SUB1 may be defined to include the first base substrate BS1, the buffer layer BFL, and the first to fourth insulating layers INS1 to INS4. A first partition wall layer BR1 and a second partition wall layer BR2 may be disposed on the first substrate SUB1 and spaced apart from each other. The first and second partition wall layers BR1 and BR2 may include an organic material.

The first electrode E1 may be disposed on the first substrate SUB1 and cover the first partition wall layer BR1. For example, the first electrode E1 may be disposed on the first partition wall layer BR1 and extend to be disposed on a portion of the first substrate SUB1 that is adjacent to the first partition wall layer BR1. Accordingly, the first partition wall layer BR1 may be disposed between the first substrate SUB1 and the first electrode E1, and the first electrode E1 may entirely cover the first partition wall layer BR1.

The second electrode E2 may be disposed on the first substrate SUB1 and cover the second partition wall layer BR2, and the second electrode E2 may be spaced apart from the first electrode E1. For example, the second electrode E2 may be disposed on the second partition wall layer BR2 and extend to be disposed on a portion of the first substrate SUB1 that is adjacent to the second partition wall layer BR2. Accordingly, the second partition wall layer BR2 may be disposed between the first substrate SUB1 and the second electrode E2, and the second electrode E2 may entirely cover the second partition wall layer BR2.

The first electrode E1 may be connected to the first drain electrode DE1 through a third contact hole CH3 that is defined through the fourth insulating layer INS4. Accordingly, the first electrode E1 may be electrically connected to the driving element DT.

Each of the first and second electrodes E1 and E2 may have a single-layer structure or a multi-layered structure. As an example of the single-layer structure, each of the first and second electrodes E1 and E2 may include a reflective electrode. As an example of the multi-layered structure, each of the first and second electrodes E1 and E2 may include a reflective electrode and a transparent electrode that is disposed on the reflective electrode.

The reflective electrode may include one or more of copper (Cu), aluminum (Al), and silver (Ag) and can reflect light. The transparent electrode may include at least one of indium zinc oxide (IZO), indium tin oxide (ITO), indium gallium oxide (IGO), indium gallium zinc oxide (IGZO), and a mixture/compound thereof and can transmit light.

The first protruding electrode PE1 may be disposed on the first electrode E1, and the second protruding electrode PE2 may be disposed on the second electrode E2. As shown in FIG. 6, a plurality of first protruding electrodes PE1 may be disposed on the first electrode E1. Exemplarily, a cross-sectional view of the plurality of first protruding electrodes PE1 is shown in FIG. 6. In is understood that a plurality of second protruding electrodes PE1 may be disposed on the second electrode E2, and a cross-sectional view of the plurality of second protruding electrodes PE2 is substantially the same as that of the first protruding electrodes PE1.

The first protruding electrode PE1 may be electrically connected to the first electrode E1 by contacting the first electrode E1. The second protruding electrode PE2 may be electrically connected to the second electrode E2 by contacting the second electrode E2. The first and second protruding electrodes PE1 and PE2 may include a conductive material that is different from that of the first and second electrodes E1 and E2.

The light emitting element ED may be disposed between the first partition wall layer BR1 and the second partition wall layer BR2. In the cross-sectional view of FIG. 5, a first side of the light emitting element ED may be disposed on the first protruding electrode PE1, and a second side of the light emitting element ED that is opposite to the first side may be disposed on the second protruding electrode PE2. The first side of the light emitting element ED may contact an upper surface of the first protruding electrode PE1, the second side of the light emitting element ED may contact an upper surface of the second protruding electrode PE2, the light emitting element ED may be electrically connected to the first protruding electrode PE1 and the second protruding electrode PE2. The light emitting element ED may be electrically connected to the first and second electrodes E1 and E2 through the first and second protruding electrodes PE1 and PE2.

A first contact electrode CTE1 may be disposed on the first protruding electrode PE1 and may cover the first side of the light emitting element ED. Illustratively, the first contact electrode CTE1 is disposed on a portion of the first protruding electrode PE1 adjacent to the first side of the light emitting element ED, but the present disclosure is not limited thereto. For example, the first contact electrode CTE1 may be disposed on the entirety of the first protruding electrode PE1. The first contact electrode CTE1 may contact both of a side of the first protruding electrode PE1 that is close to the first side of the light emitting element ED and the first side of the light emitting element ED.

A second contact electrode CTE2 may be disposed on the second protruding electrode PE2 and may cover the second side of the light emitting element ED. Illustratively, the second contact electrode CTE2 is disposed on a portion of the second protruding electrode PE2 adjacent to the second side of the light emitting element ED, but the present disclosure is not limited thereto. For example, the second contact electrode CTE2 may be disposed on the entirety of the second protruding electrode PE2. The second contact electrode CTE2 may contact both of a side of the second protruding electrode PE2 that is close to the second side of the light emitting element ED and the second side of the light emitting element ED.

The first and second contact electrodes CTE1 and CTE2 may include a transparent material. For example, the first and second contact electrodes CTE1 and CTE2 may include at least one of indium zinc oxide (IZO), indium tin oxide (ITO), indium gallium oxide (IGO), indium gallium zinc oxide (IGZO), and a mixture/compound thereof, but the present disclosure is not limited thereto.

In an embodiment where the light emitting element ED has a cylindrical shape as shown in FIG. 4, a side surface (or an outer circumferential surface) of the cylindrical shape may contact the first and second protruding electrodes PE1 and PE2, and the light emitting element ED may be in line contact with the first and second protruding electrodes PE1 and PE2. The line contact has a smaller contact area than a surface contact, and the contact resistance may increase due to the smaller contact area. Generally, the contact resistance can interfere with a flow of current.

However, the first and second contact electrodes CTE1 and CTE2 cover both sides of the light emitting element ED and are disposed on the first and second protruding electrodes PE1 and PE2 so that the first and second contact electrodes CTE1 and CTE2 may increase a contact area between the light emitting element ED and are disposed on the first and second protruding electrodes PE1 and PE2. The increased contact area between the light emitting element ED and are disposed on the first and second protruding electrodes PE1 and PE2 may reduce the contact resistance between the light emitting element ED and the first and second protruding electrodes PE1 and PE2.

A fifth insulating layer INS5 may be disposed on the first substrate SUB1 and cover the first and second protruding electrodes PE1 and PE2, the light emitting element ED, and the first and second contact electrodes CTE1 and CTE2. The fifth insulating layer INS5 may include an inorganic material.

A light conversion layer LCL and a black matrix BM may be disposed on a surface of the second base substrate BS2 that faces the first base substrate BS1. The light conversion layer LCL may be disposed in the pixel area PA, and the black matrix BM may be disposed in the non-pixel area NPA. Some pixels PX may not include a light conversion layer LCL. FIG. 5 shows that the light conversion layer LCL and the black matrix BM are disposed in the same layer, but the present disclosure is not limited thereto. For example, the light conversion layer LCL and the black matrix BM may be disposed in different layers on the second base substrate BS2.

The light conversion layer LCL may include an emitter. For example, the emitter may convert a wavelength of a first color light that is generated by the light emitting element ED to emit a second color light having a different color from the first color light. In some embodiments, the emitter may include one or more quantum dots. The first color light may be a blue light, and the second color light may be a red light or a green light.

A plurality of pixels PX including the light conversion layer LCL for converting a blue light into a red light, a plurality of pixels PX including the light conversion layer LCL for converting a blue light into a green light, and a plurality of pixels PX not including the light conversion layer LCL may be disposed on the display panel DP. Thus, red, blue, and green lights can be generated by the plurality of pixels PX.

However, the embodiment of the present disclosure is not limited thereto. For example, the light conversion layer LCL can be replaced with a color filter. In addition, the light conversion layer LCL may be omitted in some or all of the pixels PX. In this case, the light emitting element ED may emit a blue light, a green light, or a red light. The black matrix BM may prevent light leakage between the plurality of pixels.

A second substrate SUB2 may be defined to include the second base substrate BS2, the light conversion layer LCL, and the black matrix BM.

A sixth insulating layer INS6 may be disposed between the first substrate SUB1 and the second substrate SUB2. The sixth insulating layer INS6 may be an optically clear adhesive film, or a pressure sensitive adhesive film.

The second substrate SUB2 may be attached to the first substrate SUB1 by the sixth insulating layer INS6. However, this is only an example, and in another embodiment of the present disclosure, the second substrate SUB2 and the sixth insulating layer INS6 may be omitted.

If the first and second protruding electrodes PE1 and PE2 are not disposed on the first and second electrodes E1 and E2, the light emitting elements ED may not be aligned in a predetermined direction with respect to the first and second electrodes E1 and E2. In this case, unlike what is shown in FIG. 3, the light emitting elements ED may not be aligned in the first direction DR1 with respect to the first and second electrodes E1 and E2 and/or may not be uniformly spaced from each other in the second direction DR2.

However, in an embodiment of the present disclosure, the first and second protruding electrodes PE1 and PE2 are disposed on the first and second electrodes E1 and E2 as shown in FIG. 3, and the light emitting elements ED may be arranged in the first direction DR1 and evenly spaced apart from each other in the second direction DR2 with respect to the first and second protruding electrodes PE1 and PE2.

Therefore, an alignment degree of the light emitting elements ED can be improved. The more specific reason why the alignment degree of the light emitting elements ED is improved will be described in detail below with respect to FIGS. 7 to 14.

FIGS. 7 to 14 are views for explaining a manufacturing method of a display device according to an embodiment of the present disclosure.

Figure 10:
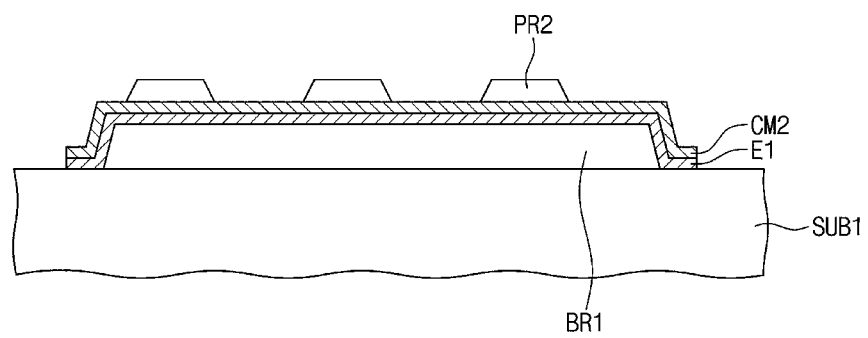
Figure 11:
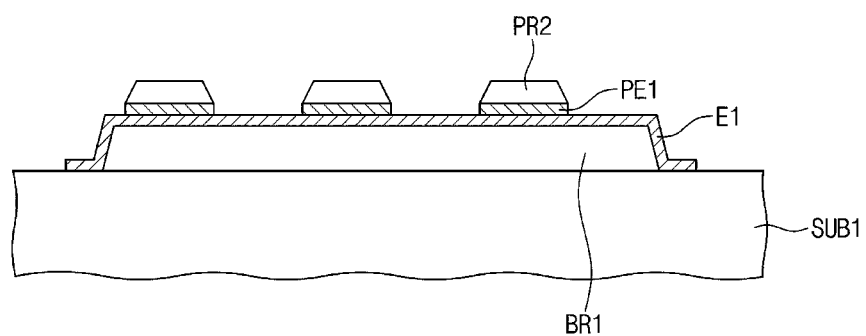
Figure 12:
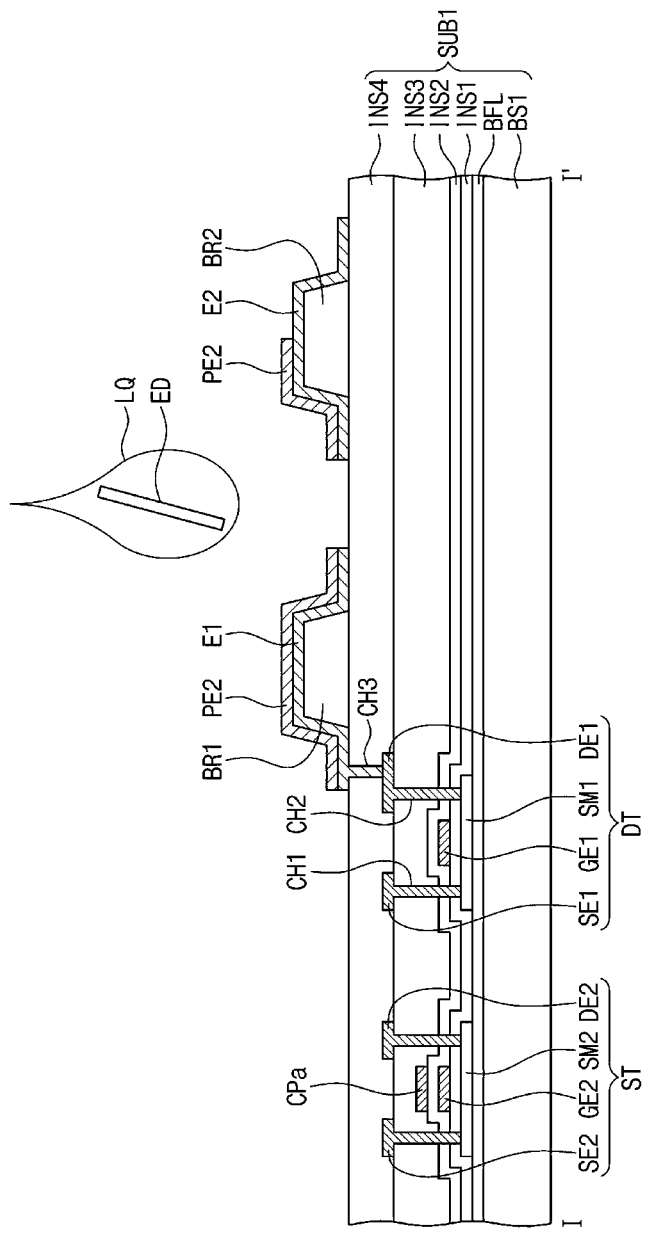
Figure 13:
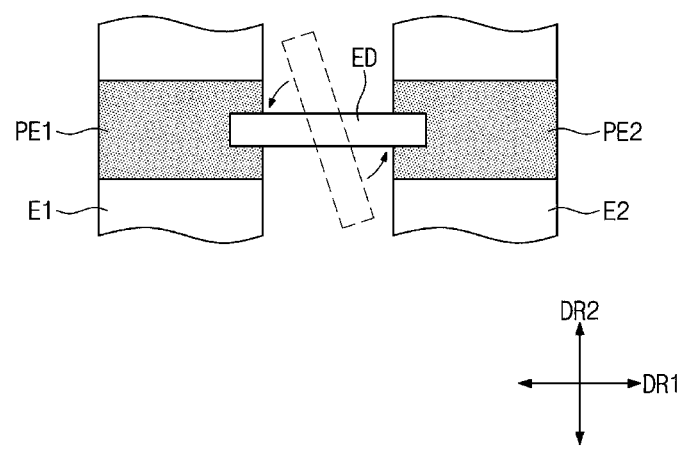
Figure 14:
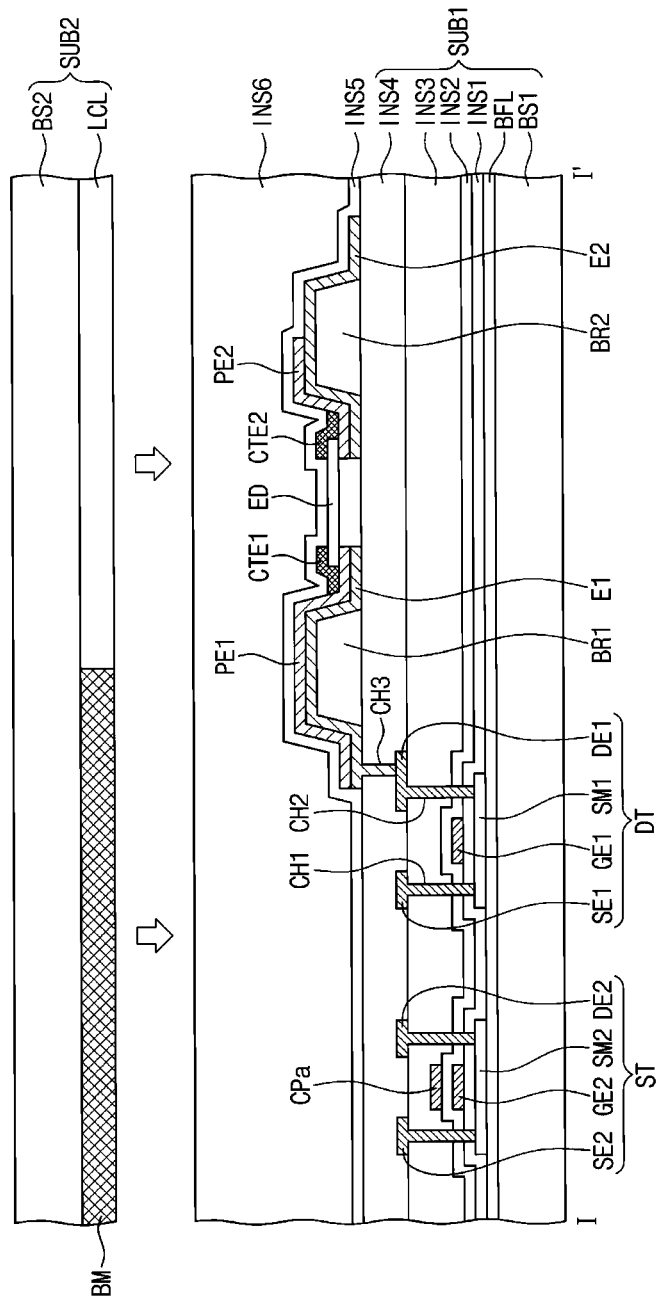

For convenience of explanation, FIGS. 7 to 11 are shown in a cross sectional view corresponding to FIG. 6, and FIGS. 12 and 14 are shown in a cross sectional view corresponding to FIG. 5. In addition, FIG. 13 shows an enlarged view of the light emitting element ED disposed between the first protruding electrode PE1 and the second protruding electrode PE2.

Below, illustratively, a manufacturing method for forming the first protruding electrodes PE1 will be described with reference to FIGS. 7 to 11, but it is understood that the second protruding electrodes PE2 may also be formed substantially in the same method as the manufacturing method shown in FIGS. 7 to 11.

Figure 7:
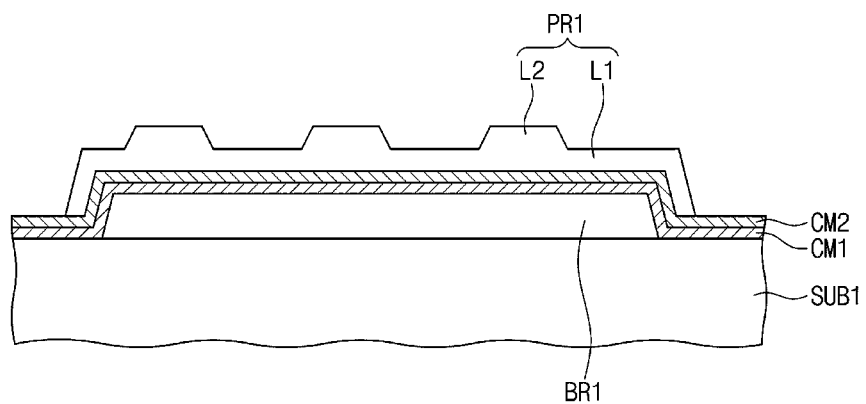
FIGS. 7 to 14 are views for showing a manufacturing method of a display device according to an embodiment of the present disclosure.

Referring to FIG. 7, a first conductive material CM1 may be provided on the first substrate SUB1, and a second conductive material CM2 may be provided on the first conductive material CM1. The first conductive material CM1 may be disposed on the first substrate SUB1 and cover the first partition wall layer BR1.

The first conductive material CM1 may be a material for forming the first electrode E1, and the second conductive material CM2 may be a material for forming the first protruding electrodes PE1. For example, the first conductive material CM1 may include a first metallic material, and the second conductive material CM2 may include a second metallic material that is different from the first metallic material.

A first photoresist pattern PR1 may be provided on the second conductive material CM2. The first photoresist pattern PR1 may include a photosensitive resin. The first photoresist pattern PR1 may include a first portion L1 and a plurality of second portions L2 that is disposed on the first portion L1 and spaced from each other. In one embodiment, the first photoresist pattern PR1 may be formed by patterning a layer or a film of a uniform thickness and removing selective portions thereof except the plurality of second portions L2. In another embodiment, a layer or a film having a uniform thickness of the first portion L1 is provided, and another layer of film having patterns of the plurality of second portions L2 is provided on the first portion L1.

Figure 8:
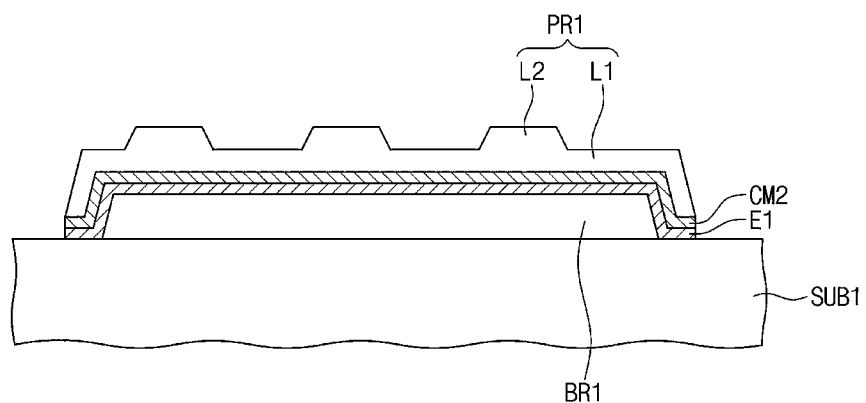

Referring to FIG. 8, a portion of the first and second conductive materials CM1 and CM2 may be removed using the first photoresist pattern PR1 as a mask. For example, a portion of the second conductive material CM2 exposed by the first photoresist pattern PR1 may be first removed to expose a portion of the first conductive material CM1 underneath, and the portion of the first conductive material CM1 exposed by the first photoresist pattern PR1 may be removed.

The portion of the first conductive material CM1 exposed by the first photoresist pattern PR1 may be removed to form the first electrode E1. The first electrode E1 may correspond to a remaining portion of the first conductive material CM1. Although not shown in the drawing, the second electrode E2 may be similarly formed of another remaining portion of the first conductive material CM1.

According to one embodiment, a wet etching method may be used for etching the first and second conductive materials CM1 and CM2. Since the first conductive material CM1 and the second conductive material CM2 may include different materials, a first etchant may be used to etch the first conductive material CM1, and a second etchant may be used to remove the second conductive material CM2. The first etchant may be a different etchant than the second etchant.

Figure 9:
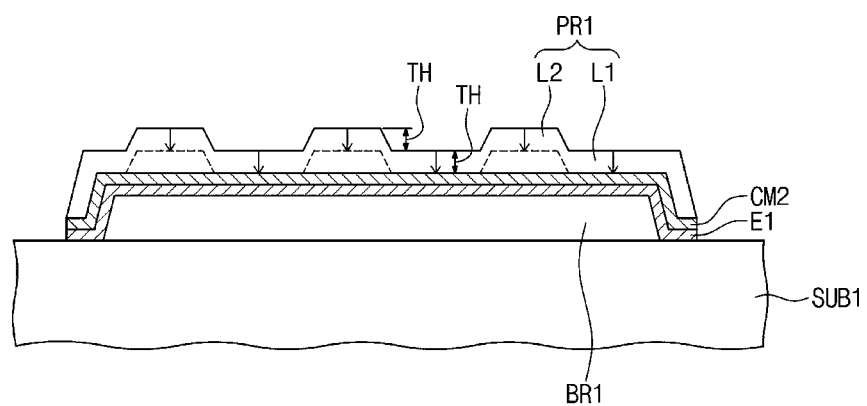

Referring to FIGS. 9 and 10, an upper portion of the first photoresist pattern PR1 may be removed by a thickness TH of the first portion L1. The thickness TH of the first portion L1 can be defined by a distance difference between a lower surface and an upper surface of the first portion L1 in a vertical direction. In addition, a portion of the first photoresist pattern PR1 disposed on a side surface of the first partition wall layer BR1 may also be removed. According to one embodiment, a dry etching method using a fluorine-based gas may be used for removing the upper portion of the first photoresist pattern PR1.

Since the first photoresist pattern PR1 is removed by the thickness TH of the first portion L1, portions of the first photoresist pattern PR1 having the thickness TH may be removed, and portions of the first photoresist pattern PR1 having a thickness greater than the thickness TH may remain. As a result, as shown in FIG. 10, a second photoresist pattern PR2 defined by the remaining portions of the first photoresist pattern PR1 may be formed.

Referring to FIG. 11, portions of the second conductive material CM2 exposed by the second photoresist pattern PR2 may be removed to form the first protruding electrodes PE1 on the first electrode E1. Although not shown in the drawing, the second protruding electrodes PE2 may also be formed on the second electrode E2 in the same method as the first protruding electrodes PE1. As described above, the second etchant may be used to etch the second conductive material CM2 to form the first protruding electrodes PE1.

If the first and second conductive materials CM1 and CM2 include the same metal material, the same etchant may be used. In such a case, the portions of the second conductive material CM2 as well as portions of the first electrode E1 exposed by the second photoresist pattern PR2 may be removed. But, in the present embodiment, the second conductive material CM2 includes a material that is different from the first conductive material CM1, and the second etchant is used to selectively etch the second conductive material CM2, so that the second conductive material CM2 may be removed, and the first electrode E1 may remain as shown in FIG. 11.

As discussed above, the second photoresist pattern PR2 may be formed by removing the upper portion of the first photoresist pattern PR1, so the second photoresist pattern PR2 corresponds to the remaining portion of the first photoresist pattern PR. In this case, the first photoresist pattern PR1 and the second photoresist pattern PR2 may be formed using a single photoresist. Therefore, the single photoresist can be used to form the first and second electrodes E1 and E2 and the first and second protruding electrodes PE1 and PE2. This is advantageous over a process in which a first photoresist may be used for forming the first and second electrodes E1 and E2 and a second photoresist that is different from the first photoresist may be used for forming the first and second protruding electrodes PE1 and PE2.

Referring to FIG. 12, the second photoresist pattern PR2 may be removed, and a solution LQ containing a light emitting element ED may be provided between the first partition wall layer BR1 and the second partition wall layer BR2. The solution LQ may be an ink or a paste. The solution LQ may be a substance that can be vaporized at a room temperature or by heat.

Referring to FIG. 13, voltages of opposite polarities may be applied to the first electrode E1 and the second electrode E2. A DC voltage or an AC voltage may be applied to the first electrode E1 and the second electrode E2. Voltages of opposite polarities may be applied to the first protruding electrode PE1 and the second protruding electrode PE2 through the first electrode E1 and the second electrode E2. Accordingly, an electric field may be formed between the first protruding electrode PE1 and the second protruding electrode PE2.

Charges can be concentrated on the first protruding electrode PE1 and the second protruding electrode PE2 that have a structure that protrudes from the first electrode E1 and the second electrode E2 as shown in FIG. 12. Accordingly, a stronger electric field may be formed between the first protruding electrode PE1 and the second protruding electrode PE2. Bipolarity is induced in the light emitting element ED by the electric field, and the light emitting element ED may be self-aligned to the first protruding electrode PE1 and the second protruding electrode PE2 by a dielectrophoretic force.

The light emitting element ED can be easily aligned toward the first protruding electrode PE1 and the second protruding electrode PE2 by a stronger electric field formed between the first protruding electrode PE1 and the second protruding electrode PE2. Accordingly, the plurality of light emitting elements ED may be uniformly aligned in the first direction DR1 and uniformly spaced in the second direction DR2 to be connected to the first protruding electrodes PE1 and the second protruding electrodes PE2. As a result, an alignment degree of the light emitting elements ED can be improved.

Referring to FIG. 14, the first and second contact electrodes CTE1 and CTE2 may be provided on the light emitting element ED and the first and second protruding electrodes PE1 and PE2, respectively. The fifth insulating layer INS5 may be provided on the first substrate SUB1 and cover the first and second protruding electrodes PE1 and PE2, the light emitting element ED, and the first and second contact electrodes CTE1 and CTE2. The display device DD may be manufactured by providing the sixth insulating layer INS6 on the fifth insulating layer INS5 and providing the second substrate SUB2 on the sixth insulating layer INS6.

In relation to a display device and a method of manufacturing the same according to an embodiment of the present disclosure, an alignment degree of light emitting elements of the display device may be improved by aligning the light emitting elements to the first protruding electrodes that are disposed on the first electrode and the second protruding electrodes that are disposed on the second electrode.

Although the exemplary embodiments of the present disclosure have been described, it is understood that the present disclosure should not be limited to these exemplary embodiments, but various changes and modifications can be made by one ordinary skilled in the art within the spirit and scope of the present disclosure as hereinafter claimed.

What is claimed is:

1. A manufacturing method of a display device, the method comprising:
    providing a first conductive material on a substrate;
    providing a second conductive material on the first conductive material;
    providing a first photoresist pattern comprising a first portion on the second conductive material and a plurality of second portions spaced apart from each other and disposed on the first portion;

removing portions of the first and second conductive materials that are exposed by the first photoresist pattern to form a first electrode and a second electrode defined by remaining portions of the first conductive material;

removing the first photoresist pattern from an upper portion of the first photoresist pattern by a thickness of the first portion to form a second photoresist pattern;

removing portions of the second conductive material that are exposed by the second photoresist pattern to form a plurality of first protruding electrodes and a plurality of second protruding electrodes; and electrically connecting a plurality of light emitting elements to the plurality of first protruding electrodes and the plurality of second protruding electrodes.

2. The method of claim 1, wherein the first electrode comprises:
 a first extension portion extending in a first direction; and
 a plurality of first branch portions extending from the first extension portion in a second direction intersecting the first direction, wherein the second electrode comprises:
 a second extension portion extending in the first direction; and
 a plurality of second branch portions extending from the second extension portion in the second direction, wherein the first branch portions and the second branch portions are alternately disposed in the first direction.

3. The method of claim 2, wherein the plurality of first protruding electrodes are arranged in the second direction and contact the first electrode, wherein the plurality of second protruding electrodes are arranged in the second direction and contact the second electrode.

4. The method of claim 3, wherein the plurality of first protruding electrodes and the plurality of second protruding electrodes are spaced uniformly in the second direction.

5. The method of claim 1, further comprising:

providing a first partition wall layer between the substrate and the first electrode; and providing a second partition wall layer between the substrate and the second electrode.

6. The method of claim 5, wherein the electrically connecting of the plurality of light emitting elements to the plurality of first protruding electrodes and the plurality of second protruding electrodes comprises:

providing the plurality of light emitting elements between the first partition wall layer and the second partition wall layer; and applying voltages of opposite polarities to the first electrode and the second electrode to respectively dispose both sides of each of the plurality of light emitting elements on a corresponding pair of first and second protruding electrodes among the plurality of first protruding electrodes and the protruding electrodes second protruding electrodes.

7. The method of claim 6, further comprising:

providing a first contact electrode on a first protruding electrode of the corresponding pair of first and second protruding electrodes; and providing a second contact electrode on a second protruding electrode of the corresponding pair of first and second protruding electrodes, wherein the first contact electrode covers a first side of each of the plurality of light emitting elements and the second contact electrode covers a second side of each of the plurality of light emitting elements.

8. The method of claim 1, wherein the plurality of first protruding electrodes and the plurality of second protruding electrodes comprise a conductive material that is different from that of the first electrode and the second electrode.

* * * * *